United States Patent [19]

Wegmann

[11] 4,448,653

[45] May 15, 1984

[54] CATHODE ARRANGEMENT FOR SPUTTERING MATERIAL FROM A TARGET IN A CATHODE SPUTTERING UNIT

[75] Inventor: Urs Wegmann, Balzers, Liechtenstein

[73] Assignee: Balzers Aktiengesellschaft, Liechtenstein

[21] Appl. No.: 311,267

[22] Filed: Oct. 30, 1981

[30] Foreign Application Priority Data

Oct. 14, 1980 [CH] Switzerland .................. 7637/80

[51] Int. Cl.³ .............................................. C23C 15/00
[52] U.S. Cl. .................................. 204/298; 204/192 R
[58] Field of Search ........................... 204/298, 192 R

[56] References Cited

U.S. PATENT DOCUMENTS

| | | | |
|---|---|---|---|
| 4,162,954 | 7/1979 | Morrison | 204/298 |
| 4,180,450 | 12/1979 | Morrison | 204/298 |
| 4,198,283 | 4/1980 | Class et al. | 201/298 |
| 4,219,379 | 8/1980 | Clark | 204/298 |
| 4,265,729 | 5/1981 | Morrison | 204/298 |
| 4,282,083 | 8/1981 | Kertesz et al. | 204/298 |
| 4,391,697 | 7/1983 | Morrison | 204/298 |

*Primary Examiner*—Arthur P. Demers
*Attorney, Agent, or Firm*—McGlew and Tuttle

[57] ABSTRACT

A cathode arrangement for sputtering material from a target in a cathode sputtering unit comprises a frame-shape magnet disposed adjacent the target and remote from the surface to be sputtered and another magnet located within the frame-shape magnet. The directions of magnetization of the two magnets form an angle of from 45 to 90 degrees. The frame-shape magnet is made of a permanent magnet material having an energy density of at least 40 kJ per m³. The other magnet is made of a permanent magnet material having an energy density of less than 40 kJ per m³.

10 Claims, 7 Drawing Figures

CATHODE ARRANGEMENT FOR SPUTTERING MATERIAL FROM A TARGET IN A CATHODE SPUTTERING UNIT

FIELD AND BACKGROUND OF THE INVENTION

The present invention relates to a cathode arrangement for sputtering the material of a target in a cathode sputtering unit, comprising a frame-shape magnet which is disposed at the target side remote from the surface to be sputtered.

Arrangements of this kind are known, for example, from U.S. Pat. No. 4,166,018. In such prior art, to obtain an as high as possible plasma density in front of the surface to be sputtered, the magnets are so arranged that the greatest possible amount of lines of magnetic force passes across the target plate to emerge from the front side thereof and return therein again. Each line of force thus forms an arc spanning the surface area to be sputtered, and the arrangement is such that the arcs altogether form a sort of a tunnel closed in itself in which the plasma is enclosed during the sputtering operation. The material is sputtered primarily within the area covered by this tunnel. The sputtering efficiency has been substantially increased in this way, however, the disadvantage still remains that the sputtering is irregular, wherefore the target plates must be replaced even before they are completely consumed. With the high prices of many of the target materials, this may be a considerable loss.

To come to a better utilization, it has been provided to arrange a plurality of magnet sets behind the target plate in a way such as to obtain an extension of the magnetic field component parallel to the surface, under a maximum possible portion of the target area; that is, experience has shown that the sputtering rate mainly depends on this parallel component of the magnetic field.

From U.S. Pat. No. 4,180,450, it is known to dispose at the backside of the target plate further magnets, in addition to the first magnet or set of magnets, in such a manner that their direction of magnetization is at an angle of 45° to 90° to the direction of magnetization of the first magnets. This does result in a more regular sputtering of most of the target materials, however, it has been found that even with this, or with other prior art arrangements, it is hardly possible to sputter magnetizable materials, such as nickel or even iron. The reason of this difficulty is that with a magnetizable target, the lines of magnetic force are to a large extent short-circuited by the material and are then missing in the discharge region in front of the target, so that no sufficiently strong discharges can be maintained in that region. The thickness of targets of magnetizable materials known in the prior art is limited to some tenths of a millimeter, at best.

This limitation results from the magnetic energy available in the effective region. That is, to succeed in sputtering ferromagnetic materials, this energy must be high enough to magnetically saturate the target and thus to let a satisfactory amount of lines of force extend thereacross; at a distance of some millimeters in front of the surface to be sputtered, the lines of force passing across should result in a magnetic field component parallel to the surface and having an induction of at least 100 gauss.

It is self-suggesting and has already been proposed, to solve this problem by correspondingly strengthening the magnets. For this purpose, with the present state of the art, only permanent-magnet material of expensive special alloys is available. Component parts of such materials are therefore costly, cannot be worked easily, and, because of their exceedingly strong dynamic effects, are difficult to assemble to a system and to mount.

Prior art sputtering devices assisted by a magnetic field have a further drawback if thicker targets are employed, even if the targets are of non-magnetic materials. In such a case again, due to the greater thickness, the strength of the magnetic field at the front side of the target is unsatisfactory, so that higher striking and operating voltages are needed to obtain sufficiently high plasma densities and thus high sputtering rates. Attempts have been made to solve the problem while maintaining the geometric configuration of the magnet arrangement and field distribution, again by simply adequately increasing the strength of all of the magnets of the assembly, which is possible in principle, however, as mentioned above, entails substantially higher expenses.

SUMMARY OF THE INVENTION

The present invention is directed on an arrangement resulting in an improved economy in cathode sputtering of materials particularly also ferromagnetic materials, by making it possible to increase the thickness of the target and thus the amount of target material available for sputtering in a single operating cycle.

In accordance with the invention a cathode for sputtering material from a target include a frame-shape magnet disposed adjacent the target and remote from the surface to be sputtered and another magnet provided within the frame-shape magnet. The directions of magnetization of the two magnets from an angle of between 45 and 90 degrees. The frame-shape magnet is made of permanent magnet material having an energy density of at least 40 kJ per m$^3$ and the other magnet is made of a permanent magnet material having an energy density of less than 40 kJ per m$^3$.

Accordingly it is an object of the invention to provide an improved cathode arrangement for sputtering material from a target in a cathode sputtering unit which is simple in design, rugged in construction and economical to manufacture.

DESCRIPTION OF THE PREFERRED EMBODIMENTS

Figure 1:
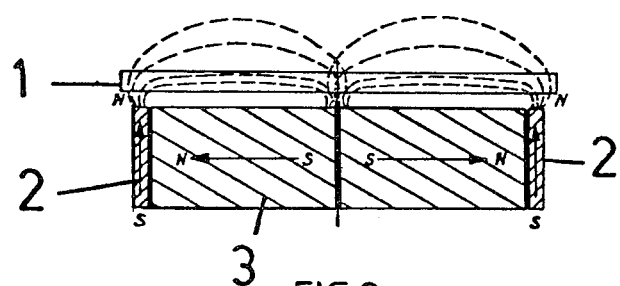
FIG. 1 is a diagrammatical sectional view of a simple embodiment of the invention in which only an outer frame of high-energy magnetic material is provided, with the direction of magnetization of the low-energy material disposed within this frame forming an angle of 90° with the direction of magnetization of the outer magnet.
Figure 2:
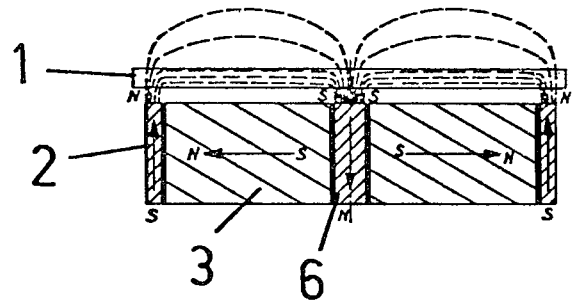
FIG. 2 is a view similar to FIG. 1 with an additional central magnet of a high-energy material of another embodiment.

Referring to the drawings in particular, the invention embodied therein, FIGS. 1 and 2 both include a plate 1 of material to be sputtered. In FIGS. 1 and 2, a plate 1 of the material to be sputtered, for example a six mm thick nickel plate, is shown. The sputtering is to be effected from one side of the plate (the upper one in the figures), as uniformly as possible, in a cathode sputtering unit. For this purpose, two magnets or magnet sets 2 and 3 are provided at the other side (lower side in the figures) of plate 1, of which a first magnet or set of magnets 2 forms an outer frame and is magnetized in the direction perpendicular to the surface to be sputtered as indicated by arrows and poles N and S; the direction of magnetization may also be opposite. The magnet or magnets forming the outer frame 2 are made of a permanent-magnet material having a remanent energy content of at least 40 kJ per $m^3$. Such materials are commercially available; for example, a known magnetic alloy of rare earths and cobalt, pressed with a plastic binder, has a remanent energy content of 50 kJ per $m^3$, and the same material in solid form without a binder has even a higher remanent energy of more than 100 kJ per $m^3$. Frame 2 may be annular, oval, or rectangular, for example, and made of a single piece or assembled of individual magnets. Within frame 2, a second magnet or set of magnets 3 is disposed forming a plate (FIG. 1) or a ring (FIG. 2) and being made of a low-energy magnetic material which is magnetized in a direction forming an angle of 90° with the direction of magnetization of the outer frame, as indicated by the arrows and poles, with the poles (N) at the outside of inner magnets 3 and the poles near the target of the outer magnets 2 forming the frame, being identical thus both north poles in the figures. Reversed directions of magnetization may be provided, so that then both of the poles would be south poles.

Due to this arrangement of lines of magnetic force at the outside close substantially in the region of the target plate; the magnetic stray flux losses thus remain small. Even if the target is of a magnetizable material, such as nickel, whereby a portion of the magnetic flux is short-circuited, the other portion of the magnetic flux penetrating the target plate force in front of the target plate to be sputtered a field having a sufficiently strong component parallel to the plate.

The arrangements shown in FIGS. 1 and 2 may be provided in a conventional cathode sputtering unit, with a negative high voltage of some hundred volt to be applied to the target plate operating as a cathode during the sputtering, and the positive terminal of the voltage source being applied, in a manner known per se, to a separate anode in the form of a bar or ring, for example, or simply to the wall of the sputtering chamber.

Figure 3:
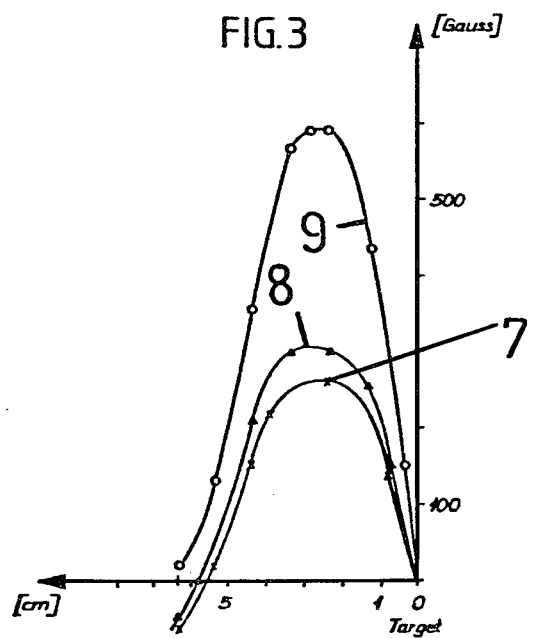
FIG. 3 is a diagram in which the invention is compared with the prior art.

According to FIG. 2, another or additional high-energy magnet 6 is provided in addition at the center of the target plate, and magnetized in the direction opposite to that of outer magnets 2. Due to this additional high-energy magnet, the magnetic flux is further increased, so that still thicker targets may be sputtered than with the arrangement of FIG. 1. In the diagram of FIG. 3, the ordinate indicates the magnetic induction parallel to the target surface, at a distance of about 16 mm from the magnetic system, in gauss, as a function of the distance of the point of measurement from an imaginary axis passing through the center of the target plate. Curve 7 relates to a prior art arrangement as mentioned above. As shown in the diagram, with the prior art arrangement, a parallel magnetic field intensity of 250 gauss has been obtained in a zone spaced by about 2 to 3.5 centimeters from the plate center. Still in the prior art arrangement, the use of high-energy magnets 2 instead of the hitherto usual low-energy magnets, resulted in a somewhat stronger parallel component of about 300 gauss. With the inventive arrangement designed in accordance with FIG. 2, on the contrary, a substantially higher parallel field intensity of 600 gauss has been produced. Consequently, the arrangement of FIG. 2 makes it possible to sputter substantially thicker targets.

Further tests have shown that depending on the material and thickness of the target plate, a mutual orientation deviating from 90° of the direction of magnetization of the low-energy inner magnet and high-energy outer magnets may advantageously lead to a still better utilization of the target material.

Figure 4:
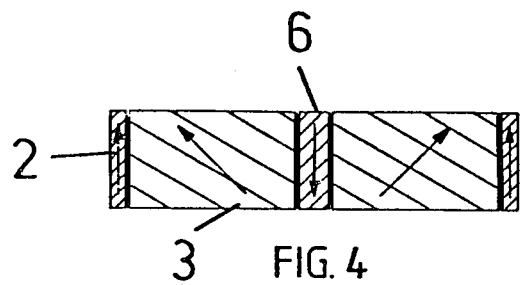
FIG. 4 is a sectional view of another embodiment of the invention, with the directions of magnetization of the high-energy and low-energy materials forming an angle of 45°.

Diagrammatic FIG. 4 shows a design with a 45° orientation of the direction of magnetization, as indicated by the arrows.

Figures 5, 6:
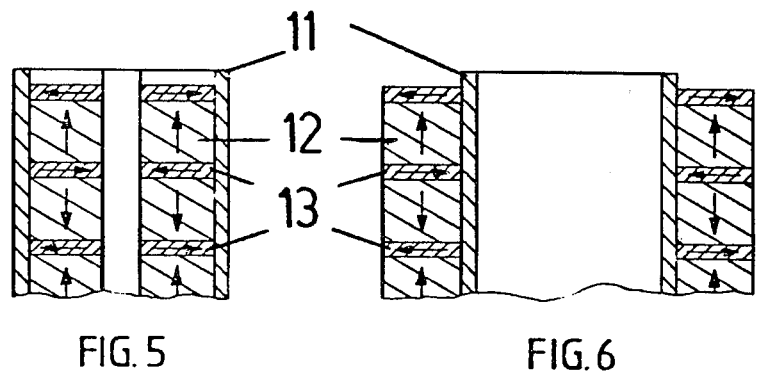
FIG. 5 is a sectional view of an arrangement for sputtering the outside of a tube of target material.
FIG. 6 is a sectional view of an arrangement for sputtering the inside of a tube of target material.

The application of the invention is not limited to plane target surfaces. FIGS. 5 and 6 illustrates the applications showing how cylindrical surfaces can be sputtered. These figures show a tubular target, whose outside (FIG. 5) or inside (FIG. 6) is to be subjected to sputtering. For this purpose, annular, low-energy magnets 12 and high-energy, radially magnetized magnets 13 are provided at the respective other side of the target not to be sputtered, thus at the inside (FIG. 5) or the outside (FIG. 6) of the tube, with the directions of magnetization of the magnetic systems forming an angle between 45° and 90°; FIGS. 5 and 6 show designs with an angle of 90°. A cylindrical cathode construction of such design can be operated in a sputtering unit substantially in the way as described in connection with the plane target plate.

Figure 7:
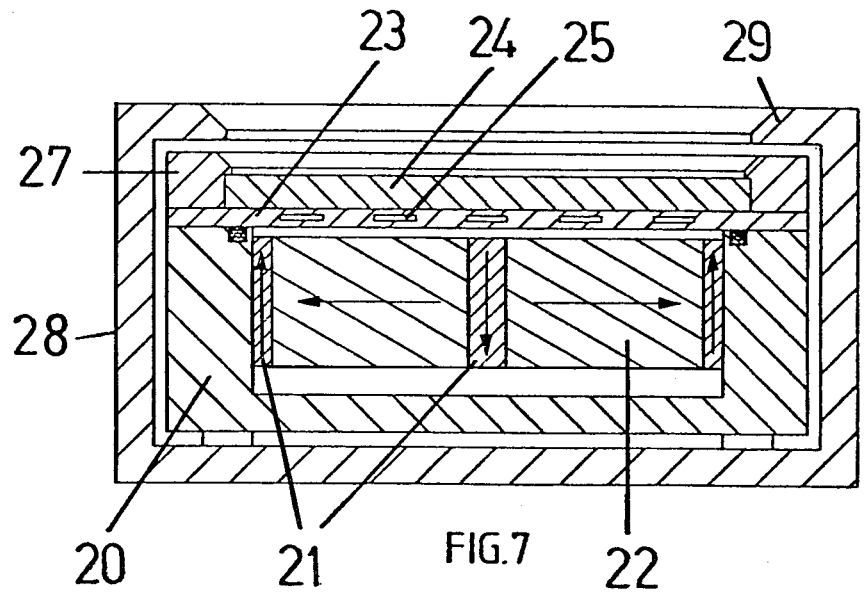
FIG. 7 shows in detail a construction of a so-called planar magetron constructed in accordance with the invention including a flat cooled target plate.

FIG. 7 shows another arrangement with a plane target plate. The magnet arrangement is similar to that of FIG. 2 and comprises a supporting structure 20, a high-energy outer magnet 21, and a low-energy inner magnet 22. The magnets are covered by a cooling plate 23 carrying the target plate 24. Plate 23 is provided with passages 25 through which a coolant can be circulated during operation, to cool the target plate. At its periphery, the target plate is embraced by a ring 27 which, along with plate 23, is screwed to supporting structure 20. For operation, an electrical connection (not shown) must be provided to target plate 24. Supporting structure 20 is surrounded by a housing 28 having an opening 29 by which only the front side of the target surface is exposed for sputtering. In a known manner, the width of the gap between the inside wall surface of the housing and the outside surface of supporting structure 20 must be smaller than the mean free path of the electrons at the discharge pressure.

While specific embodiments of the invention have been shown and described in detail to illustrate the application of the principles of the invention, it will be understood that the invention may be embodied otherwise without departing from such principles.

What is claimed is:

1. A cathode arrangement for sputtering material from a target in a cathode sputtering unit, comprising a frame-shape magnet being disposed adjacent the target remote from the surface to be sputtered, and another magnet being provided within said frame-shap magnet, and with the directions of magnetization of the two magnets forming an angle of between 45° and 90°, said frame-shape magnet being made of a permanent-magnet mterial having an energy density of at least 40 kJ per $m^3$ and the other magnet being made of a permanent-magnet material having an energy density of less than 40 kJ per $m^3$.

2. A cathode arrangement according to claim 1, wherein said energy content difference between the materials of said frame-shape magnet and said another magnet is at least 10 kJ per $m^3$.

3. A cathode arrangement according to claim 1, including an additional magnet disposed centrally of said frame-shape magnet having an energy density of more than 40 kJ per $m^3$.

4. A cathode arrangement according to claim 1, wherein said frame-shape magnet comprises a magnet of high-energy material, said another magnet comprising a magnet of low-energy material and they form magnetization directions which are at an angle of 90° in respect to each other.

5. A cathode arrangement according to claim 1, wherein said frame-shape magnet and said another magnet are mounted for movement relative to the target.

6. A cathode arrangement according to claim 1, including a support structure, a housing for said support structure in which said support structure is located having a top opening, said frame-shape magnet and said another magnet being mounted on said support structure below the top opening, the target plate positioned on said support structure above said cathode arrangement.

7. A cathode arrangement according to claim 6, including means for mounting said support structure at a spaced location from the interior of said housing.

8. A cathode arrangement according to claim 6, including a cooling plate mounted over said cathode arrangement and supporting said target.

9. A cathode arrangement according to claim 1, wherein said frame-shape magnet comprises an annular member, said another magnet being annular in form, and a tube comprising a material to be sputtered positioned around said annular member.

10. A cathode arrangement according to claim 1, wherein said target is a tube, said magnet and said another magnet being positioned around said tube.

* * * * *